(12) United States Patent
Taylor

(10) Patent No.: US 6,781,189 B2
(45) Date of Patent: Aug. 24, 2004

(54) FLOATING GATE TRANSISTOR WITH STI

(75) Inventor: Theodore M. Taylor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/056,179

(22) Filed: Jan. 22, 2002

(65) Prior Publication Data

US 2003/0137003 A1 Jul. 24, 2003

(51) Int. Cl.$^7$ .................. H01L 29/788; H01L 20/00
(52) U.S. Cl. ........................... 257/317; 257/510
(58) Field of Search ................ 257/317, 510

(56) References Cited

U.S. PATENT DOCUMENTS

| | | | |
|---|---|---|---|
| 5,767,005 A | | 6/1998 | Doan et al. |
| 6,054,733 A | | 4/2000 | Doan et al. |
| 6,083,803 A | | 7/2000 | Fischer et al. |
| 6,153,494 A | * | 11/2000 | Hsieh et al. .............. 438/211 |
| 6,214,667 B1 | * | 4/2001 | Ding et al. .............. 438/257 |
| 6,271,561 B2 | * | 8/2001 | Doan .................... 257/316 |
| 6,376,877 B1 | * | 4/2002 | Yu et al. ................. 257/315 |
| 6,448,606 B1 | * | 9/2002 | Yu et al. ................. 257/315 |
| 6,459,121 B1 | * | 10/2002 | Sakamoto et al. ........ 257/315 |
| 6,461,915 B1 | | 10/2002 | Rudeck |
| 6,573,583 B2 | * | 6/2003 | Hokazono ............... 257/486 |
| 2002/0000603 A1 | * | 1/2002 | Sakakibara et al. ..... 257/315 |
| 2002/0028541 A1 | | 3/2002 | Lee et al. |
| 2002/0093073 A1 | * | 7/2002 | Mori et al. ............. 257/510 |
| 2002/0160571 A1 | | 10/2002 | Tsang |

OTHER PUBLICATIONS

Kobayashi, T., et al., "A 0.24–μm sq. Cell Process wiht 0.18–um Width Isolation and 3–D Interpoly Dielectric Folms for 1–Gb Flash Memories", Dec. 1997, IEDM 97, pp. 275–278.*

Shirai, H., et al., "A0.54 μm sq. Self–Aligned HSG Floating Gae Cell (SAHF Cell) for 256Mbit Falsh Memories", Dec. 1995, IEDM 95, pp. 653–656.*

* cited by examiner

Primary Examiner—Long Pham
Assistant Examiner—Howard Weiss
(74) Attorney, Agent, or Firm—Wells St. John P.S.

(57) ABSTRACT

Embodiments in accordance with the present invention provide for forming floating gate transistor structures as well as the structures so formed. An exemplary method provides a substrate encompassing semiconductive material. A first layer is formed over the semiconductive material. At least one pair of spaced shallow trench isolation (STI) structures are formed extending through the first layer and into the semiconductive material, and at least a portion of the first layer between the spaced STI structures is removed effective to form a recess there between. The recess is at least partially filled by forming a conductive floating gate material therein and a control gate is formed operatively over the conductive floating gate material to form the floating gate transistor.

14 Claims, 4 Drawing Sheets

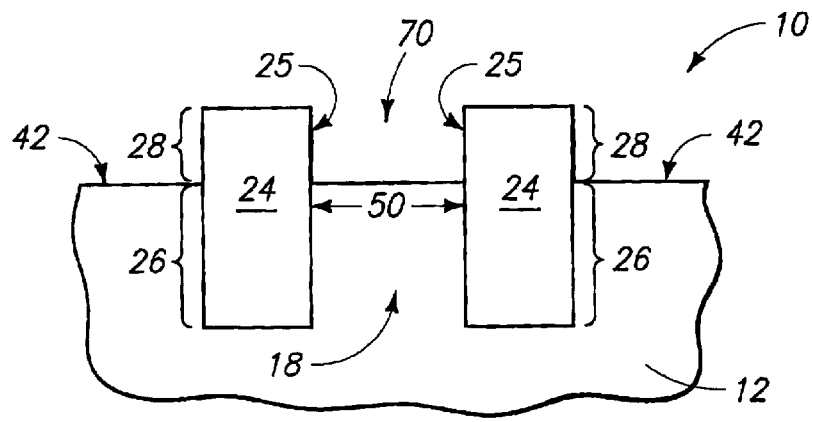
_FIG 4_
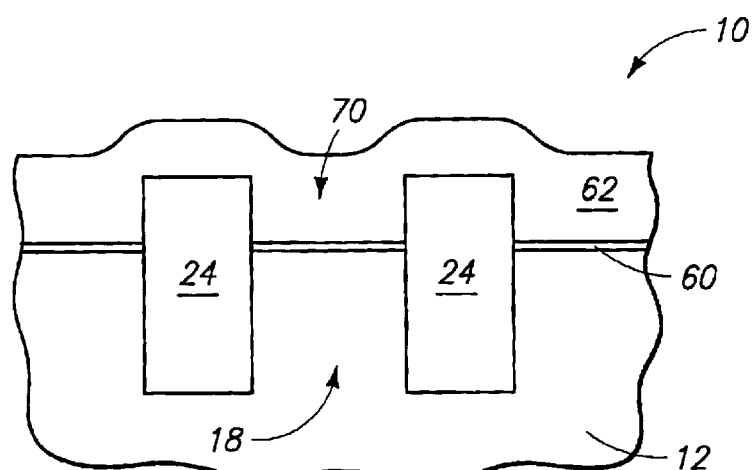
_FIG 5_
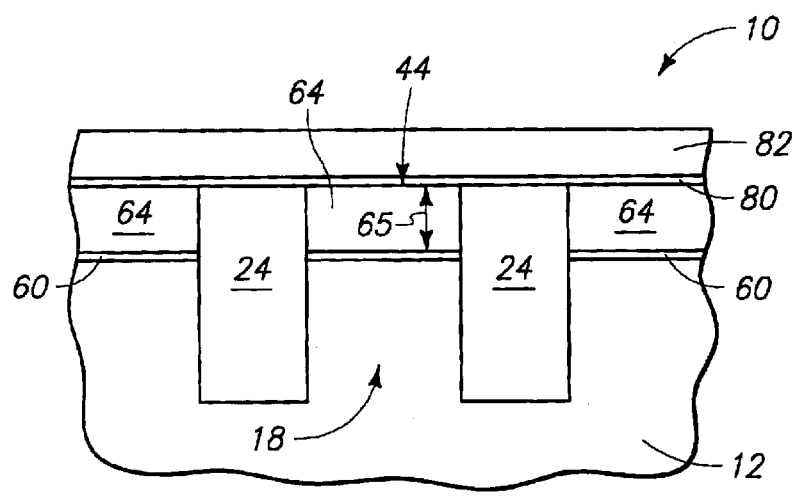
_FIG 6_

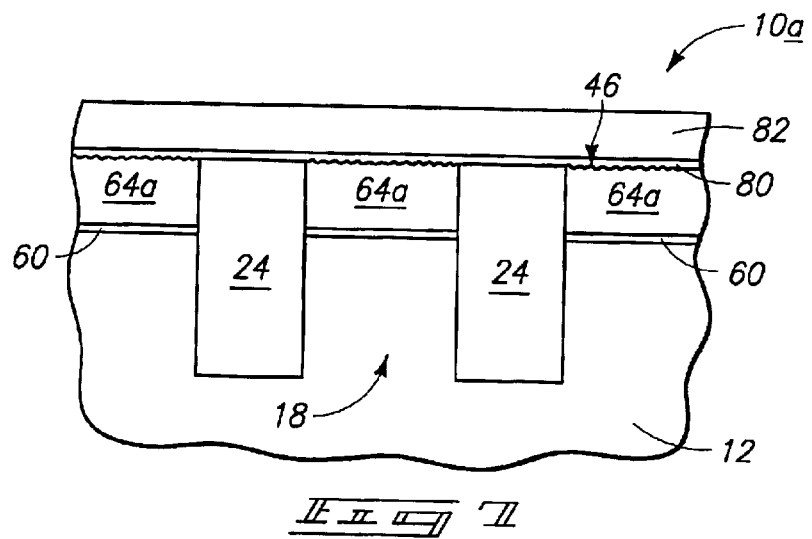
_FIG. 7_
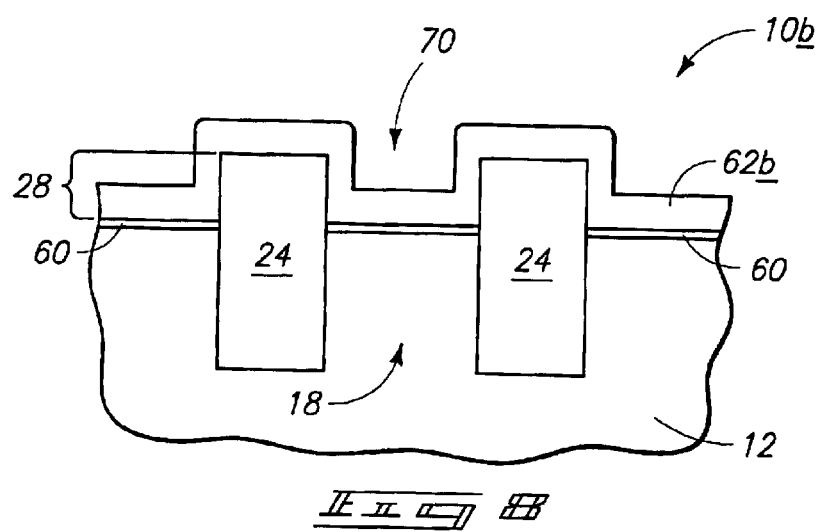
_FIG. 8_
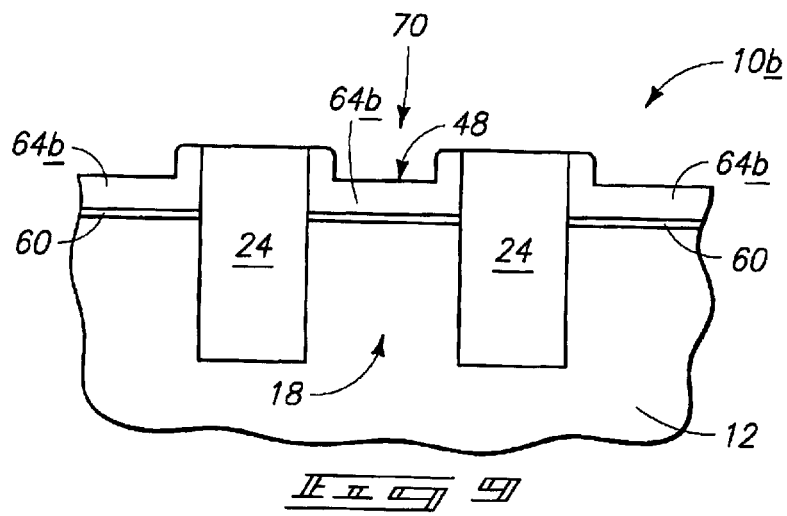
_FIG. 9_

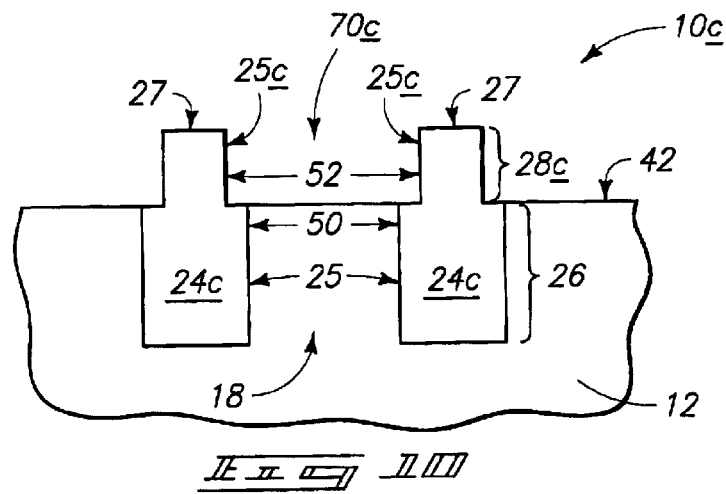
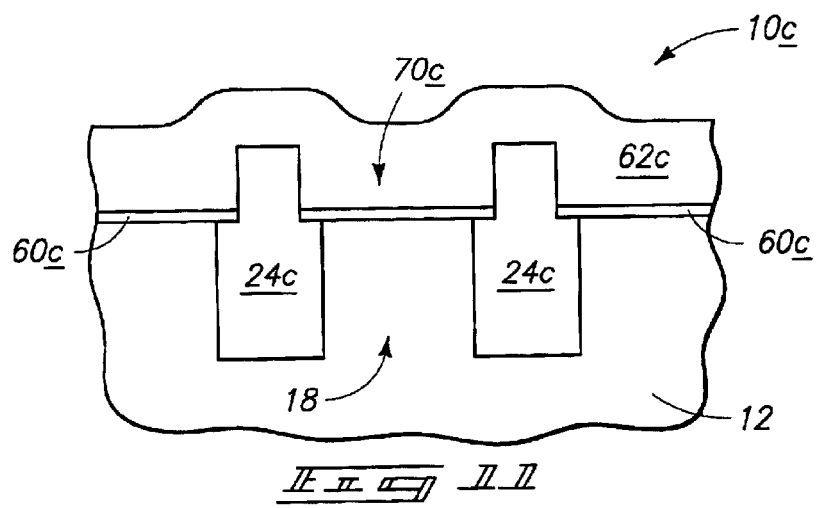
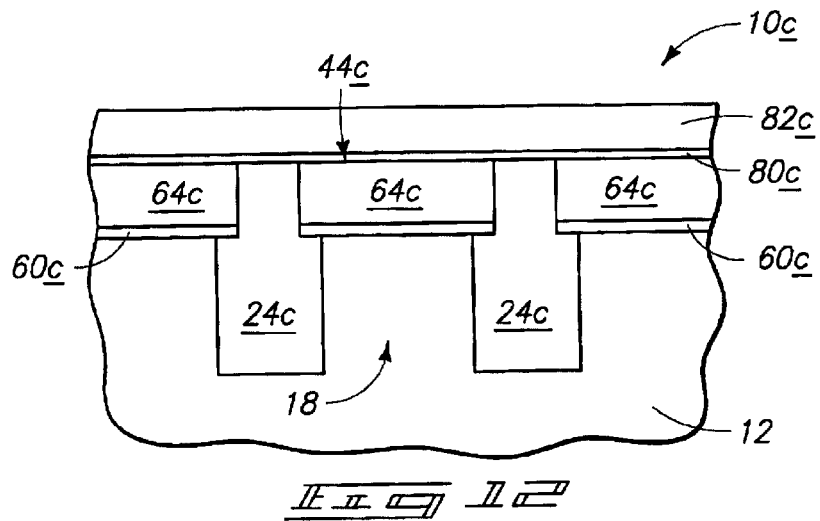

FLOATING GATE TRANSISTOR WITH STI

TECHNICAL FIELD

The present invention relates generally to semiconductor processing methods of forming floating gate transistors and to floating gate transistors.

BACKGROUND

Increased device performance is a continuing goal of efforts in advancing the semiconductor arts. For nonvolatile memory devices such as a programmable read only memory (PROM), increased device performance has been realized by improvements in both the programmability and erasure of the stored information. For example, early PROM devices were erased using exposure of the integrated circuit to ultra-violet light for a period of time on the order of twenty minutes to erase the entirety of the stored memory. Newer devices such as an electrically erasable programmable read only memory (EEPROM), as the name implies, are erasable using an electrical signal. While such EEPROM devices have reduced erasure time, the electrical signal employed for erasing is at a higher than normal voltage that results in a limiting of the number of times the device can be erased and reprogrammed. In addition, generally, erasing such EEPROM devices results in all stored information being erased.

More recently developed devices such as the flash-EEPROM device have provided the ability to use normal electrical voltages for erasure as well as providing for partial erasures. As such erasures and subsequent reprogramming are possible at essentially "normal" semiconductor speeds, flash-EEPROM devices are also generally referred to as a flash random access memory device or flash-RAM. With the increased performance of the flash-RAM, it has become desirable to increase the density of the memory storage units which generally encompass both a floating gate and a control gate for each unit. One problem with forming devices with such increased density has been the forming of the floating gate structures using generally known photolithographic methods. Therefore it would be desirable to provide alternative methods for forming floating gate transistor structures as well as the structures formed employing such methods.

SUMMARY

Exemplary embodiments of forming floating gate transistor structures in accordance with the present invention employ providing a substrate encompassing semiconductive material. A first layer is formed over the semiconductive material. At least one pair of spaced shallow trench isolation (STI) structures are formed extending through the first layer and into the semiconductive material, and at least a portion of the first layer between the spaced STI structures is removed effective to form a recess there between. The recess is at least partially filled by forming a conductive floating gate material therein and a control gate is formed operatively over the conductive floating gate material to form the floating gate transistor.

BRIEF DESCRIPTION OF THE DRAWINGS

The present invention may be better understood, and its numerous objects, features, and advantages made apparent to those skilled in the art by referencing the accompanying drawings. For ease of understanding and simplicity, where the element is the same between drawings common numbering of elements within such drawings is employed.

FIG. 4 is a cross-sectional representation of the portion of a semiconductor substrate depicted in FIG. 3 at a subsequent process stage of an exemplary embodiment of the present invention.

FIG. 5 is a cross-sectional representation of the portion of a semiconductor substrate depicted in FIG. 4 at a subsequent process stage of an exemplary embodiment of the present invention.

FIG. 6 is a cross-sectional representation of the portion of a semiconductor substrate depicted in FIG. 5 at a subsequent process stage of an exemplary embodiment of the present invention.

FIG. 7 is a cross-sectional representation of a portion of a semiconductor substrate of another exemplary embodiment of the present invention resulting from the substrate depicted in FIG. 5 and an alternate subsequent process stage.

FIG. 8 is a cross-sectional representation of a portion of a semiconductor substrate of another exemplary embodiment of the present invention resulting from the substrate depicted in FIG. 4 and an alternate subsequent process stage.

FIG. 9 is a cross-sectional representation of the portion of a semiconductor substrate depicted in FIG. 8 at a subsequent process stage of an exemplary embodiment of the present invention.

FIG. 10 is a cross-sectional representation of a portion of a semiconductor substrate of another exemplary embodiment of the present invention resulting from the substrate depicted in FIG. 5 and an alternate subsequent process stage.

FIG. 11 is a cross-sectional representation of the portion of a semiconductor substrate depicted in FIG. 10 at a subsequent process stage of another exemplary embodiment of the present invention.

FIG. 12 is a cross-sectional representation of the portion of a semiconductor substrate depicted in FIG. 11 at a subsequent process stage of an exemplary embodiment of the present invention.

DETAILED DESCRIPTION

This disclosure of the invention is submitted in furtherance of the constitutional purposes of the U.S. Patent Laws "to promote the progress of science and useful arts" (Article 1, Section 8).

Exemplary embodiments of the present invention will be described with reference to the aforementioned figures. To aid in interpretation of the description of the illustrations and claims that follow, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 1:
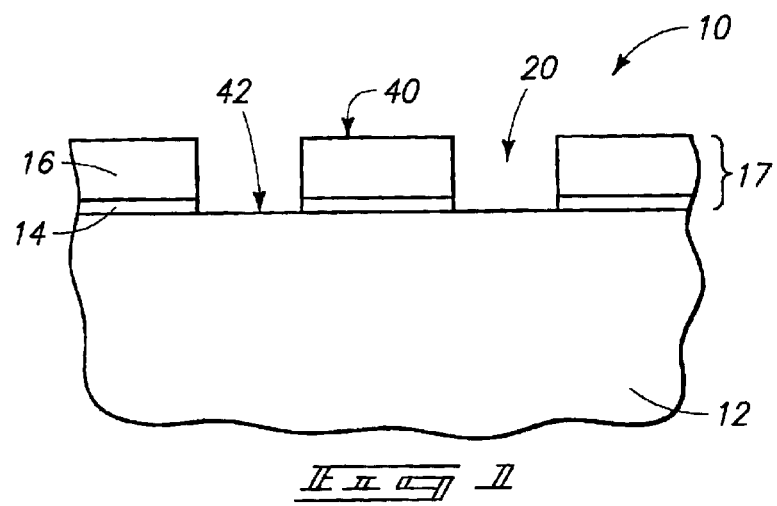
FIG. 1 is a cross-sectional representation of a portion of a semiconductor substrate at an early process stage of an exemplary embodiment of the present invention.

FIG. 1 is a cross-sectional representation of a portion of a semiconductor substrate 10 having patterned masking material portions 17 disposed over a semiconductive material 12. Material 12 includes an outermost surface 42. Patterned masking material portions 17 encompass masking portions 16 and can also include optional pad oxide portions 14. Masking portions 16 include outermost surface 40. By way of example, patterned masking material portions 17 can be formed by forming a masking material layer (not shown) over semiconductive material 12 and then employing a photo patterning and etch process to remove portions of such masking material layer to define masking material portions 17. Where optional pad oxide portions 14 are desired, they are formed prior to the masking portions 16 and the resulting masking material portions 17 encompass both pad oxide portions 14 and masking portions 16. In some embodiments, a photoresist material employed in the photo-patterning and etch process is removed from over masking portions 16, in other embodiments, such photoresist material (not shown) is not removed. As shown, the photo patterning and etch process advantageously defines openings 20 between pairs of portions 17. Such provides but one example of forming the masking material 17 (here a composite of layers 14 and 16, with or without the photoresist material) over semiconductive material 12.

Advantageously, the pad oxide layer can be provided using a thermally grown or deposited silicon oxide comprising material having an exemplary thickness of from about 5 nanometers (nm) to about 15 nm. The masking layer can be provided using a deposited silicon nitride comprising material having an exemplary thickness of from about 30 nm to about 150 nm. However, other appropriate materials and or thicknesses can also be used.

Figure 2:
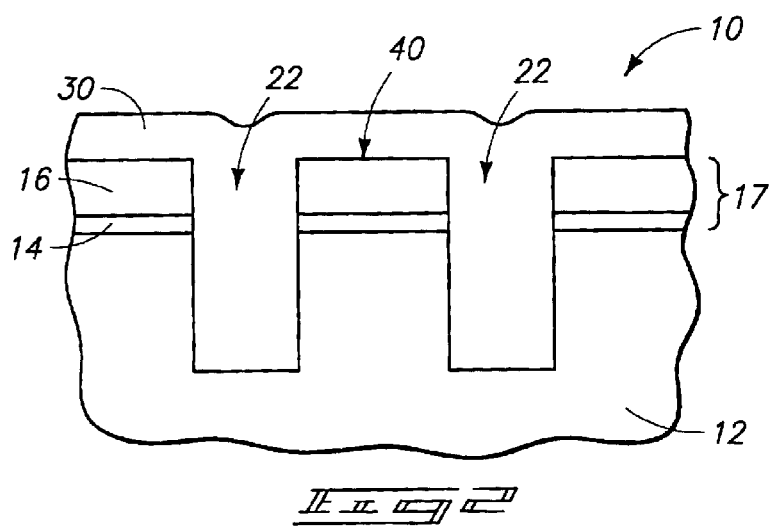
FIG. 2 is a cross-sectional representation of the portion of a semiconductor substrate depicted in FIG. 1 at a subsequent process stage of an exemplary embodiment of the present invention.

Turning to FIG. 2 and using patterned masking portions 17 as a mask, portions of semiconductive material 12 are removed from substrate 10 effective to at least partially form at least two shallow isolation (STI) trenches 22 within semiconductive material 12. As depicted in FIG. 2, such STI trenches 22 are completely formed. In the context of this document, "shallow" means less than or equal to about 500 nm. After removing the semiconductive material, insulative isolation material layer 30 is formed within the at least two trenches 22 and over outermost surface 40 of masking portions 17, as depicted. Where masking portions 17 include photoresist material, such is removed prior to forming material layer 30. One exemplary insulative material layer 30 comprises silicon oxide, for example, silicon oxide formed by high density plasma (HDP) deposition methods.

Figure 3:
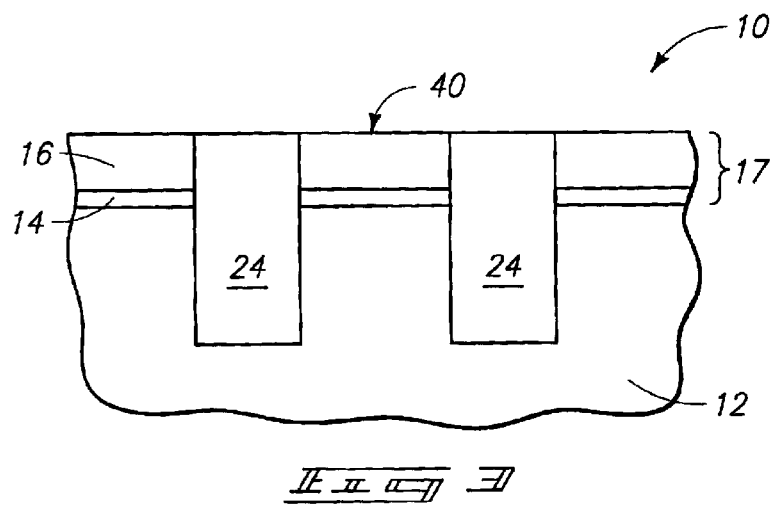
FIG. 3 is a cross-sectional representation of the portion of a semiconductor substrate depicted in FIG. 2 at a subsequent process stage of an exemplary embodiment of the present invention.

Referring to FIG. 3, insulative material layer 30 (FIG. 2) has been planarized such that STI structures or masses 24 are formed of the insulative material. As depicted, outermost surfaces 40 of masking portions 17 are exposed. Exemplary embodiments of the present invention generally employ chemical mechanical polishing (CMP) for such planarization although other appropriate methods can also be used. Advantageously, the planarization process employed removes the material of insulative layer 30 (FIG. 2) selectively to the material of masking portion 17. In preferred embodiments, the initial thickness of portion 17 is reduced by no more than about 20% by the planarization. The above provides but one example of forming insulative isolation material within the shallow isolation trenches.

Turning to FIG. 4, at least a portion of masking material portions 17 has been removed effective to define a recess 70 over semiconductive material 12. As depicted, substantially all of masking portions 17 has been removed to form recess 70 and provide for a portion of the insulative isolation material to project outwardly from semiconductive material 12. As shown, STI structures or masses 24 can be considered as having a first portion 26 that is received within semiconductive material 12 and a second portion 28 that extends, or projects, outwardly from outermost surface 42 of material 12. STI masses 24 have opposing sides 25, and are substantially parallel and spaced apart from one another. Opposing sides 25 of first portion 26 define an active area region 18 within semiconductive material 12, and opposing sides 25 of second portion 28 define recess 70 elevationally above surface 42 of semiconductive material 12. Advantageously, second portion 28 extends outward from uppermost surface 42 by a dimension essentially equal to the thickness of portion 17 just prior to its removal.

A first cross-sectional dimension 50 of active area 18 is shown proximate outermost surface 42 between opposing sides 25. Masking portions 17 are preferably removed using a process that selectively removes portions 17 with respect to STI masses 24 and semiconductive material 12. Where masking portions 17 encompass a silicon nitride comprising material and STI masses 24 encompass an HDP deposited oxide comprising material, an exemplary process for the removing encompasses the use of hot phosphoric acid.

In FIG. 5, a gate dielectric comprising a first dielectric layer 60 is shown formed over semiconductive material 12 and a conductive floating gate material layer 62 is shown formed over dielectric layer 60 and STI masses 24. In the exemplary embodiment of FIG. 5, conductive floating gate material layer 62 is formed with a thickness sufficient to completely fill recess 70.

By way of example only, first dielectric material layer 60 can be a silicon oxide comprising material generally formed employing a thermal oxidation processes. In other embodiments, dielectric layer 60 can encompass other materials or combinations of materials. For example in one alternate embodiment, dielectric layer 60 encompasses an ONO (silicon oxide-silicon nitride-silicon oxide) layer. The thickness of first dielectric material layer 60 can be a function of both the specific material used as well as a function of the device characteristics of the floating gate transistor ultimately formed. An exemplary thickness range for dielectric material layer 60 is from about 1 nm to about 20 nm. Further by way of example only, conductive floating gate material layer 62 can be formed of a polycrystalline silicon comprising material or an amorphous silicon comprising material that is subsequently converted to a polycrystalline material, and which is conductively doped.

Referring now to FIG. 6, the structure of FIG. 5 is depicted after conductive floating gate material layer 62 is planarized, forming conductive floating gate material portions or floating gates 64. Floating gates 64 include outermost surfaces 44. As discussed with respect to the planarization of insulative material layer 30 (FIG. 2), CMP is also advantageously employed in exemplary embodiments of the present invention for the planarization of floating gate material layer 62. In addition, material 62 can be patterned at this time, if desired, to define end edges of floating gates 64 (not viewable in FIG. 6). For the embodiment depicted in FIG. 6, floating gates 64 have a thickness 65 approximately equal to the thickness of the masking material portion 17 (FIG. 3) that was removed to form recess 70 (FIG. 4), thus as depicted, floating gate 64 has essentially filled recess 70. Partial filling of recess 70 is also contemplated as will be discussed below.

Still referring to FIG. 6, a second dielectric layer 80 is shown formed overlying outermost surfaces 44 of floating gates 64 and STI masses 24. Second dielectric layer 80 can be formed of a silicon oxide comprising material or other appropriate dielectric materials, for example ONO. An exemplary thickness for dielectric layer 80 is from about 1 nm to about 50 nm. A control gate 82 is depicted disposed over second dielectric layer 80 and is, accordingly, operatively over floating gate 64. An exemplary material for control gate 82 is doped polycrystalline silicon.

FIG. 7 depicts another exemplary embodiment 10a, of the present invention. After conductive floating gate material layer 62 (FIG. 5) is planarized, forming conductive floating gate material portions or floating gates 64a, a roughened surface 46 can be formed by roughening an outermost surface of the conductive floating gate material from what it was prior to the roughening. Where conductive floating gate material layer 62 encompasses a polycrystalline silicon comprising material, such roughening can be advantageously accomplished by chemically etching the planarized floating gate material. An exemplary chemical etching process encompasses a $H_2O$:conc. $H_2O_2$:conc. $NH_3$ (5:1:1) solution maintained at about 65° C. Advantageously, it has been found that the degree of roughness obtained from the aforementioned chemical etching process, can be controlled by varying the etch solution temperature and/or concentration ratio(s).

Alternatively, by way of example only, the roughening can encompass forming a rugged conductive material layer on the conductive floating gate material. An example of such rugged conductive material layer is hemispherical grain polysilicon. However, other appropriate materials can also be employed. It will be noted that the forming of roughened surface 46 provides such surface with an increased surface area from what such surface area was prior to the roughening.

Referring now to FIG. 8, another embodiment 10b of the present invention is depicted where a conductive floating gate material layer 62b is formed having a reduced thickness from that of floating gate material layer 62 depicted in FIG. 5. As shown, floating gate material layer 62b is formed having a thickness which is less than the amount second portion 28 (FIG. 4) extends outwardly from surface 42 of semiconductive material 12. Thus, when floating gate material layer 62b is planarized, as shown in FIG. 9, a floating gate material portion or floating gate 64b is formed that only partially fills recess 70 and which has an outermost surface 48 which is essentially concave in cross-section. Outermost surface 48 has a surface area which is greater than a surface that is essentially straight across in cross-sectional view. In addition, while not depicted, it will be understood that outermost surface 48 of floating gate 64b can be roughened analogous to that of outermost roughened surface 46 shown in FIG. 7. Thus by providing floating gate 64b having a roughened outermost surface, the surface area of such a surface can be further increased, if desired.

Referring now to FIG. 10, another exemplary embodiment 10c of the present invention is shown. The structure of FIG. 4 is shown after removing material from opposing sides 25 of masses 24 effective to widen at least a portion of recess 70. As depicted in FIG. 10, essentially all of recess 70 is widened to form widened recess 70c.

After the removal of the material, first portion 26 of STI structures or masses 24c advantageously remains essentially unchanged from that depicted in FIG. 4. Thus, opposing sides 25 of first portion 26 still define active area 18 which has first cross-sectional dimension 50 proximate outermost surface 42. However a second portion 28c has opposing sides 25c and a top 27, elevationally above sides 25c, which define widened recess 70c. Recess 70c has a second cross-sectional dimension 52 that is larger than first cross-sectional dimension 50, proximate tops 27. Such a widened recess 70c is advantageously formed by removing material from STI masses 24 (FIG. 4) advantageously employing a removal process that removes more material from the opposing sides than from the tops. Thus, the rate of removing material from the tops is slower than the rate of removing material from the sides.

FIG. 11 is analogous to FIG. 5 where STI masses 24 of FIG. 5 are replaced with STI masses 24c as discussed above. Thus, first dielectric layer 60c is shown formed over semiconductive material 12 and conductive floating gate material layer 62c is shown formed over dielectric layer 60 and STI masses 24c. The exemplary embodiment of FIG. 11 depicts conductive floating gate material layer 62c formed with a thickness sufficient to completely fill recess 70c.

The structure of FIG. 12 is formed in a manner analogous to that of the structure of FIG. 6, discussed above. Thus, conductive floating gate material portions or floating gates 64c can be formed by planarizing conductive floating gate material layer 62c. Floating gates 64c encompass outermost surfaces 44c. Material 62c can be patterned at this time, if desired, to define end edges of floating gate 64c (not viewable in FIG. 12). As depicted in the embodiment of FIG. 12, floating gates 64c have a thickness approximately equal to the thickness of the masking material portion 17 (FIG. 3) that was removed to form recess 70 (FIG. 4) and floating gate 64c have essentially filled recesses 70c. In addition, floating gates 64c having roughened or rugged outermost surfaces and/or essentially concave surfaces are also contemplated.

Still referring to FIG. 12, second dielectric layer 80c is shown formed overlying outermost surfaces 44c of floating gates 64c and STI masses 24c. A control gate 82c is depicted disposed over second dielectric layer 80c and is, accordingly, operatively over floating gate 64c.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A floating gate transistor structure, comprising:

a substrate comprising semiconductive material;

a pair of spaced shallow trench isolation (STI) masses having first portions received within the semiconductive material and having second portions projecting outwardly from the semiconductive material to a respective upper planar surface, the first and second portions each having opposing sides, the opposing sides of the first portions defining an active area of the semiconductive material therebetween, the active area of the semiconductive material having an upper planar surface extending between the first portion opposing sides, each of the opposing sides of the first portions comprising a straight segment which is normal relative to the active area upper planar surface, each of the opposing sides of the second portions comprising a straight segment which is normal relative to the active area upper planar surface, the straight opposing segments of the second portions being displaced laterally relative to the straight opposing segments of the first portions and thereby defining opposing straight step surfaces of the pair of masses extending between the respective straight segments of the first and second portions, the opposing straight step surfaces being normal each of the respective straight segments of the first and second portions, the opposing straight step surfaces being elevationally aligned with and extending from the active area upper planar surface to a respective one of the straight segments of the second portions, each of the straight segments of the second portions extending from a respective one of the straight step surfaces to a respective top upper planar surface of the STI masses;

a first gate dielectric layer received over the upper planar surface of the active area and over the straight step surfaces of the pair of masses, the first gate dielectric layer having uppermost surface portions received over the straight step surfaces which are parallel with the active area upper planar surface and which are parallel with the straight step surfaces, the first gate dielectric layer uppermost surface portions being received elevationally below the upper planar surfaces of the spaced shallow trench isolation masses, the first gate dielectric layer including straight laterally outermost surfaces which bear against the straight segments of the second portions, the straight laterally outermost surfaces each being normal to the active area upper planar surface and each being parallel with each of the straight segments of the first portions and the second portions;

a floating gate received over the first gate dielectric layer;

a second gate dielectric layer received over the floating gate; and a control gate operatively overlying the second dielectric layer and operatively coupled to the floating gate.

2. The floating gate transistor of claim 1 wherein the opposing sides of the second portions define a region therebetween, the floating gate only partially filling the region.

3. The floating gate transistor of claim 1 wherein the opposing sides of the second portions define a region therebetween, the floating gate completely filling the region.

4. The floating gate transistor of claim 1 wherein the floating gate comprises a roughened uppermost surface.

5. The floating gate transistor of claim 1 wherein the opposing sides of the second portions define a region therebetween, the floating gate only partially filling the region and comprising an essentially concave uppermost surface.

6. The floating gate transistor of claim 1 wherein the opposing sides of the second portions define a region therebetween, the floating gate completely filling the region and comprising an essentially concave uppermost surface.

7. The floating gate transistor of claim 1 wherein the first dielectric layer comprises a silicon oxide.

8. The floating gate transistor of claim 1 wherein the second dielectric layer comprises a silicon oxide.

9. The floating gate transistor of claim 1 wherein the first dielectric layer and the second dielectric layer each comprises a silicon oxide.

10. The floating gate transistor of claim 1 wherein the first dielectric layer comprises ONO.

11. The floating gate transistor of claim 1 wherein the second dielectric layer comprises ONO.

12. The floating gate transistor of claim 1 wherein the first dielectric layer and the second dielectric layer each comprises ONO.

13. The floating gate transistor of claim 1 wherein the floating gate comprises hemispherical grain polysilicon.

14. The floating gate transistor of claim 1 wherein the isolation masses each comprise a silicon oxide.

* * * * *

UNITED STATES PATENT AND TRADEMARK OFFICE
CERTIFICATE OF CORRECTION

PATENT NO. : 6,781,189 B2
DATED : August 24, 2004
INVENTOR(S) : Theodore M. Taylor It is certified that error appears in the above-identified patent and that said Letters Patent is hereby corrected as shown below:

Title page,
Item [56], References Cited, OTHER PUBLICATIONS,
"Shirai" reference, please delete "Falsh" after "256Mbit" and insert -- Flash --.

Column 4,
Line 36, please delete "processes" after "oxidation" and insert -- process --.

Signed and Sealed this

Fifth Day of April, 2005

JON W. DUDAS
*Director of the United States Patent and Trademark Office*